United States Patent
Wallash et al.

(10) Patent No.: US 11,477,881 B2
(45) Date of Patent: Oct. 18, 2022

(54) SPARK GAP ELECTROSTATIC DISCHARGE (ESD) PROTECTION FOR MEMORY CARDS

(71) Applicant: SanDisk Technologies LLC, Addison, TX (US)

(72) Inventors: Albert Wallash, Morgan Hill, CA (US); Shajith Musaliar Sirajudeen, Bengaluru (IN); John Thomas Contreras, Palo Alto, CA (US)

(73) Assignee: SanDisk Technologies LLC, Addison, TX (US)

( * ) Notice: Subject to any disclaimer, the term of this patent is extended or adjusted under 35 U.S.C. 154(b) by 529 days.

(21) Appl. No.: 16/453,074

(22) Filed: Jun. 26, 2019

(65) Prior Publication Data

US 2020/0413531 A1    Dec. 31, 2020

(51) Int. Cl.
| | |
|---|---|
| *H05K 1/02* | (2006.01) |
| *H05K 1/18* | (2006.01) |
| *H05K 1/11* | (2006.01) |
| *H05K 3/30* | (2006.01) |
| *H05K 3/40* | (2006.01) |

(Continued)

(52) U.S. Cl.
CPC .......... *H05K 1/0259* (2013.01); *H02H 9/045* (2013.01); *H05K 1/111* (2013.01); *H05K 1/181* (2013.01); *H05K 3/303* (2013.01); *H05K 3/4007* (2013.01); *H05K 5/026* (2013.01); *H01L 25/0657* (2013.01); *H01L 25/18* (2013.01); *H01L 2225/0651* (2013.01); *H01L 2225/06506* (2013.01); *H01L 2225/06562* (2013.01);

(Continued)

(58) Field of Classification Search
CPC ... H05K 1/02; H05K 1/11; H05K 1/18; H05K 1/181–187; H05K 3/30; H05K 3/40; H05K 5/026; H01L 23/60; H02H 9/06; H02H 9/045–046
USPC .......... 361/64–767, 770, 784, 790, 816, 818
See application file for complete search history.

(56) References Cited

U.S. PATENT DOCUMENTS

| | | | | |
|---|---|---|---|---|
| 4,532,419 | A | * | 7/1985 | Takeda .................. G06K 19/07 235/492 |
| 4,586,105 | A | * | 4/1986 | Lippmann ................ H01T 4/08 313/325 |

(Continued)

OTHER PUBLICATIONS

Yu, Ho-Chieh, et al., "Application of Air-Discharge on Developing Chip Type ESD Suppressor (MAX Guard)," downloaded from CARTS Asia 2006, Oct. 9-13, 2006, 10 pages.

(Continued)

*Primary Examiner* — Tuan T Dinh
(74) *Attorney, Agent, or Firm* — Vierra Magen Marcus LLP

(57) ABSTRACT

To protect memory cards, such as SD type cards, and similar devices from Electrostatic Discharge (ESD), the input pads of the device include points along their edges that are aligned with correspond points on a conductive frame structure mounted adjacent the input pad to form a spark gap. The input pads are connected to a memory controller or other ASIC over signal lines that include a diode located between the input pad and the ASIC and a resistance located between the input pad and the diode. The resistance and diode are selected such that an ESD event at an input pad triggers a discharge across the spark gap before it is transmitted on to the ASIC, while also allowing a high data rate for signals along the signal line.

20 Claims, 10 Drawing Sheets

(51) Int. Cl.
*H02H 9/04* (2006.01)
*H05K 5/02* (2006.01)
*H01L 25/065* (2006.01)
*H01L 25/18* (2006.01)

(52) U.S. Cl.
CPC .............. *H05K 2201/10159* (2013.01); *H05K 2201/10424* (2013.01)

(56) References Cited

U.S. PATENT DOCUMENTS

| | | | | |
|---|---|---|---|---|
| 6,002,569 | A * | 12/1999 | Horvath | H01T 4/08 |
| | | | | 361/111 |
| 6,318,632 | B1 * | 11/2001 | Grant | G06K 7/0013 |
| | | | | 15/210.1 |
| 6,355,958 | B1 * | 3/2002 | Orchard-Webb | H01L 23/62 |
| | | | | 257/358 |
| 6,859,351 | B2 * | 2/2005 | Byrne | H05F 3/04 |
| | | | | 361/220 |
| 6,879,004 | B2 * | 4/2005 | Leung | H01L 23/62 |
| | | | | 257/363 |
| 6,945,465 | B2 * | 9/2005 | Nishizawa | G11C 5/066 |
| | | | | 235/492 |
| 7,948,726 | B2 * | 5/2011 | Troemel, Jr | H05K 1/0259 |
| | | | | 361/56 |
| 2002/0047165 | A1 | 4/2002 | Casper et al. | |
| 2004/0027779 | A1 | 2/2004 | Byrne et al. | |
| 2004/0084729 | A1 | 5/2004 | Leung et al. | |
| 2006/0044717 | A1 | 3/2006 | Hill et al. | |
| 2006/0250744 | A1 | 11/2006 | McTigue et al. | |
| 2007/0206339 | A1 | 9/2007 | Choi | |
| 2008/0266730 | A1 | 10/2008 | Viborg et al. | |
| 2010/0073834 | A1 | 3/2010 | Troemel, Jr. et al. | |
| 2011/0089540 | A1 * | 4/2011 | Drost | H01L 23/60 |
| | | | | 257/659 |
| 2012/0229941 | A1 | 9/2012 | Drost et al. | |
| 2015/0263505 | A1 | 9/2015 | Takada | |
| 2016/0007496 | A1 | 1/2016 | Kim et al. | |

OTHER PUBLICATIONS

Ehlers, Bill, "Spark gaps provide ESD protection," Analog Design Center, How to Article, Sep. 1, 1997, 3 pages.
Wallash, Albert J., et al. "Electrical breakdown and ESD phenomena for devices with nanometer-to-micron gaps," Proc. SPIE 4980, Jan. 16, 2003, 11 pages.
Williams, Doug, "bq20z80 Printed Circuit Board Layout Guide," Texas Instruments, Application Report, Mar. 2006, 8 pages.

* cited by examiner

US 11,477,881 B2

SPARK GAP ELECTROSTATIC DISCHARGE (ESD) PROTECTION FOR MEMORY CARDS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

In the course of handling memory cards or other integrated circuit devices with external contacts, an electric charge can be induced on the contacts, resulting in a voltage pulse applied from the contacts to the internal components of the device. This results in an Electrostatic Discharge (ESD), or the sudden flow of electricity into the device. The high voltages of an ESD can cause permanent damage and lead to the failure of solid state electronic components of memory cards and other integrated circuits. Because of this, it is important to protect memory cards and other devices from such electrostatic discharge events.

DETAILED DESCRIPTION

Memory cards and other electronic devices with external contacts can experience Electrostatic Discharge (ESD) at their contacts and need protection from such ESD events to avoid damage to their internal circuits. For example, SD (Secure Digital) and MicroSD cards are required to pass a +/−4 kV ESD "gun" test, in which a "gun" discharges a voltage pulse into the memory card's signal pad. To provide protection from such pulses, SD type cards incorporate diodes between the input pads and the memory controller ASIC. Although such diodes provide ESD protection, they can limit the rate of signals exchanged between the memory card and a host device. To operate at higher data rates, such as for a memory card that is to be connected to a PCI Express (PCIe) interface, the size of the diodes providing ESD protection may need to be reduced, resulting in failure at ESD levels lower than the desired level.

To improve ESD protection, a spark gap is introduced at the input pads of the memory card or other device with electronic contacts. When the spark gap breaks down, harmful ESD current will be diverted (shunted) away from the memory controller or other ASIC inputs, protecting the ASIC. To provide the spark gap, a point structure is formed on the edge on the input pad. On a conducting frame structure adjacent to the pad, a corresponding point structure is aligned to form an air gap. The points concentrate an electric field on the input pad, and the air gap between the points serves as the spark gap. To help induce the discharge of a voltage on an input pad from an ESD event before the diode connecting the input pad to the ASIC turns on, a series impedance is included between the input pad and the diode. The value of the impedance and diode size can be selected to provide the wanted ESD protection while still allowing high data rate operation. As a discharge across the spark gap may cause the points to melt, the arrangement can be made more robust by having each input pad have a number of such spark gaps.

Figure 1:
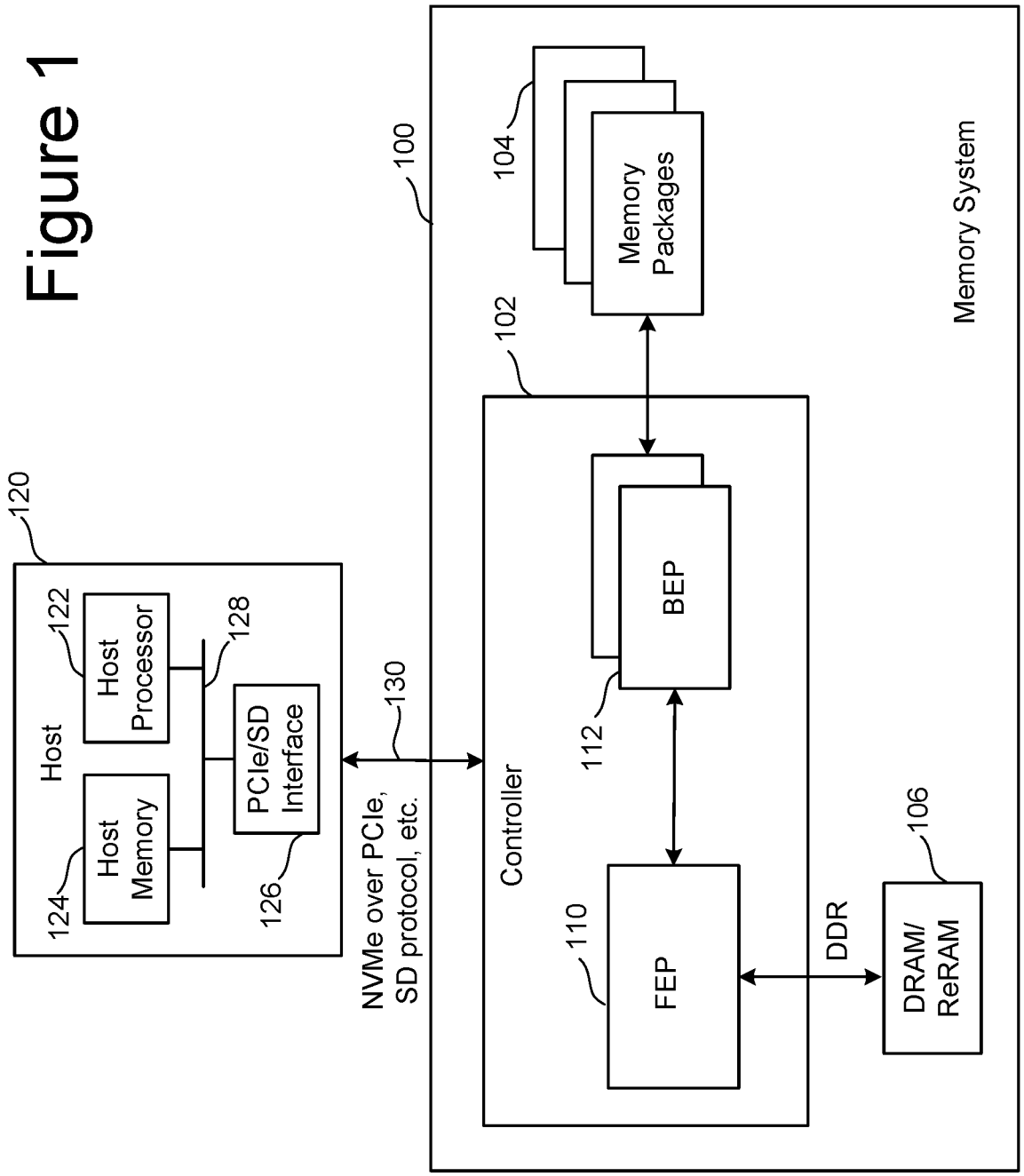
FIG. 1 is a block diagram of one embodiment of a memory system connected to a host.

FIG. 1 is a block diagram of one embodiment of a memory system 100, such as a memory card, connected to a host 120. Memory system 100 can implement the technology proposed herein, where data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the memory card, SSD, or other non-volatile storage system. The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130, where this can be an SD type interface, one that implements NVM Express (NVMe) over PCI Express (PCIe), or of other type. For working with memory system 100, host 120 includes a host processor 122, host memory 124, and a PCIe, SD, or other interface 126 connected along bus 128. Host memory 124 is the host's physical memory, and can be DRAM, SRAM, non-volatile memory or another type of storage. Host 120 is external to and separate from memory system 100.

Figure 2:
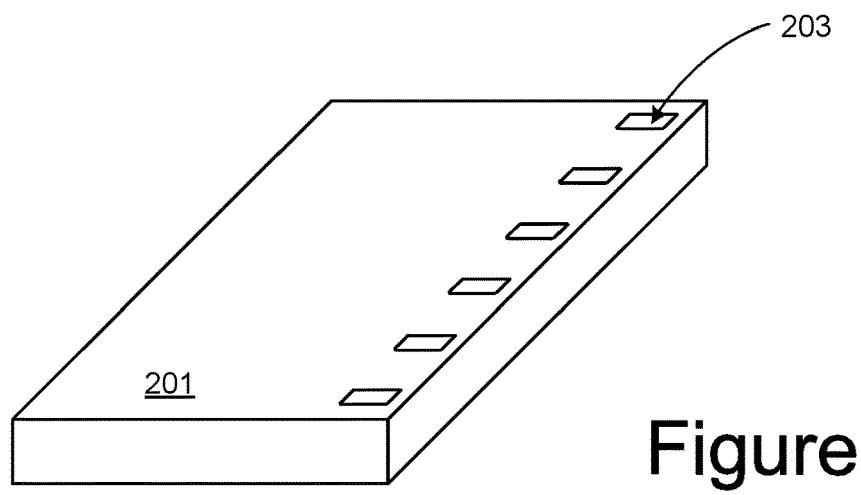
FIG. 2 is a schematic representation of an integrated circuit or semiconductor die that includes a number of die bond pads.
Figure 3:
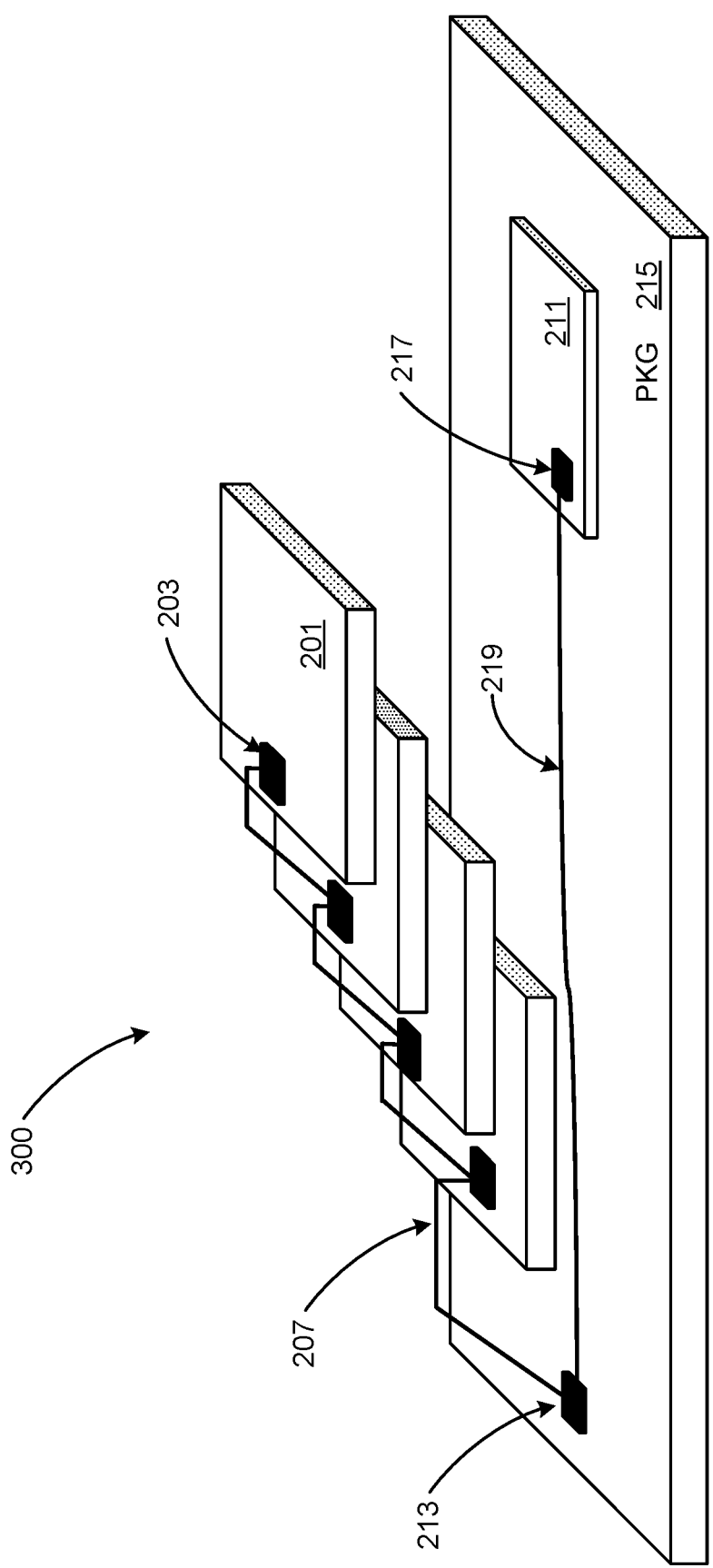
FIG. 3 is a schematic representation of a memory package of four memory die with an on-board memory controller.
Figure 4:
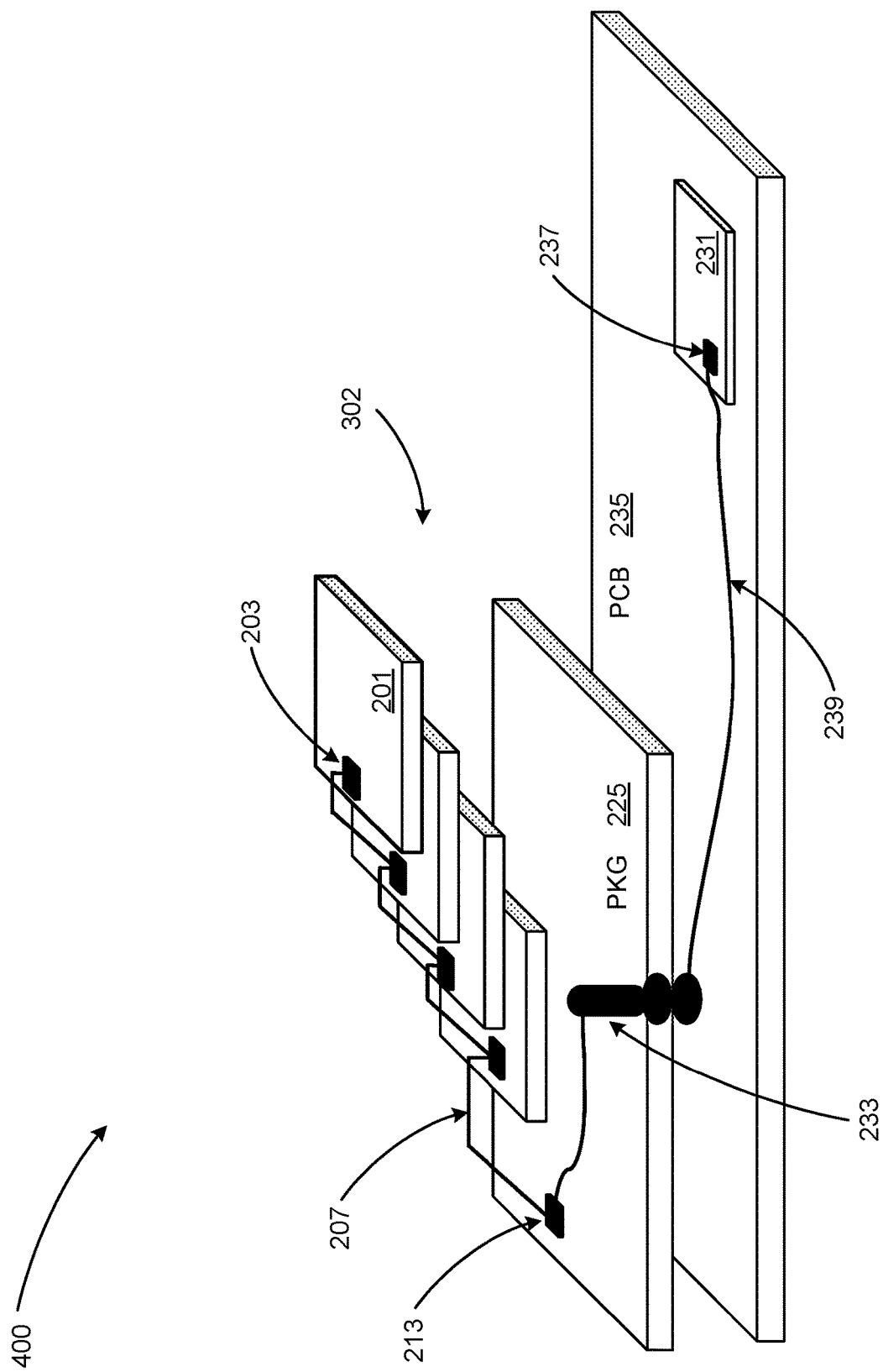
FIG. 4 is a schematic representation of a memory package attached on a printed circuit board with an external memory controller.

The following discussion will primarily be presented in the context where the memory system 100 is an SD type of memory card (e.g., SD, MicroSD, NanoSD) that includes signal pads for use with both an SD protocol and PCIe protocol. FIGS. 2-4 look at the structure of a memory package, such as a memory card, that can embody a memory system 100 in more detail.

FIG. 2 is a schematic representation of an integrated circuit or semiconductor die 201 that includes a number of die bond pads 203 by which the integrated circuit 201 can be connected by a transmission line, or bond wire, to other elements, such as other integrated circuits or a printed circuit board. The integrated circuit 201 may for example be memory die such as 2D NAND flash memory, 3D BiCS (Bit Cost Scaling), V-NAND or other 3D flash memory, and 2D and 3D memory structure based on phase change memory (PCM) technologies. but other types of die 201 may be used. These other types of semiconductor die include but are not limited to controller die such as an ASIC, or RAM such as an SDRAM, DDR SDRAM, LPDDR and GDDR.

The semiconductor die 201 may include a number of die bond pads 203 along an edge of the semiconductor die. A number of die can be combined into a package, with each die bond pad can be referred to herein as a channel, with a first die bond pad on each die arbitrarily referred to as the first channel, a second die bond pad on each die arbitrarily referred to herein as the second channel, and so on for the remainder of the die bond pads 203 on the semiconductor die 201. In some embodiments, each of the first channel die bond pads on all the die of a package may be connected to each other and a printed circuit board (PCB) or other substrate, each of the second channel die bond pads on all die may be connected to each other and the substrate, and so on across the die bond pads 203 of a die 201.

FIGS. 3 and 4 illustrate embodiments of a number of memory die combined into a package, such as a memory card, where the die bond pads of the die in the package are connected by a set of wire bonds severing the transmission lines between the memory integrated circuit. Together the memory die of one more or packages can be combined with a memory controller into a memory system, with the wire bonding interconnecting these elements serving as the system bus.

FIG. 3 is a schematic representation of a memory package 300 of four memory die 201, such as a 3D NAND or PCM memory structure, on a package board PKG 215. The memory die 201 are stacked one on another, offset somewhat to expose the bond pads 203 along the edge of the memory die 201 so that these pads can be connected wire bonds 207. To simplify the figure, only a single bond pad 203 connected by a single wire bond 207 channel is shown for each memory die 201, but where actually embodiment would have several (e.g. 8) such bus lines or channels that would form a system bus.

The stack of the memory die 201 are attached to the package board PKG 215 which includes a bond pad 213. In the embodiment of FIG. 3, the memory package 300 includes an on-board memory controller 211 ASIC. The memory controller 211 includes a set of bond pads, one of which is shown at 217, that is also connected to the board's bond pad 213 along a transmission line 219 of, for example, around 5 mm in length in a typical arrangement. The package 300 of FIG. 3 could, for example, be a memory card or one of a number of packages forming a solid state drive (SSD).

FIG. 4 is a schematic representation of an embodiment for a memory system 400 in which a package 302 of a number of memory die 201 does not include an on-board controller, but where one or more such packages are attached to a printed circuit board PCB 235 that includes an external memory controller 231 ASIC that is connected to the one or more memory package 302. The memory package 302 is formed similarly to package 300 of FIG. 3, but does not include an on-board controller on the package board PKG 225. The wire bonds 207 are again connected to an bond pad 213 on the package board PKG 225, but instead of connecting an on-board controller ASIC, a transmission line 239, typically around 50 to 200 mm long, on PKG 225 is connected to a via 233 or other connection to a transmission line 239 formed on PCB 235 that connects to the bond pad 237 of controller 231. The controller 231 is an external controller in that it is not formed as part of the memory package 302, but is rather on the PCB 235. Although only a single memory package 302 is shown in FIG. 4, the memory system may include a number of such memory packages 302 connected to a single PCB 235. A PCB 235 with one or more memory packages attached can be part of a solid state drive (SSD), for example, that may include many such PCBs as sub-components. Other additional integrated circuits and other elements may be incorporated into the package 300, package 302, included on the PCB 235, or both.

Referring back to FIG. 1, the memory system 100 communicates with the host 120 by way of the interface 130, where the physical interface from the memory system 100 side will typically include a set of external input pins, pads or contacts through which the memory system 100 receives electrical signal from the host 120. Memory cards are frequently inserted into and removed from hosts and handled by user. This can result in the external pins or pads being subjected to electrostatic charges.

Figure 6:
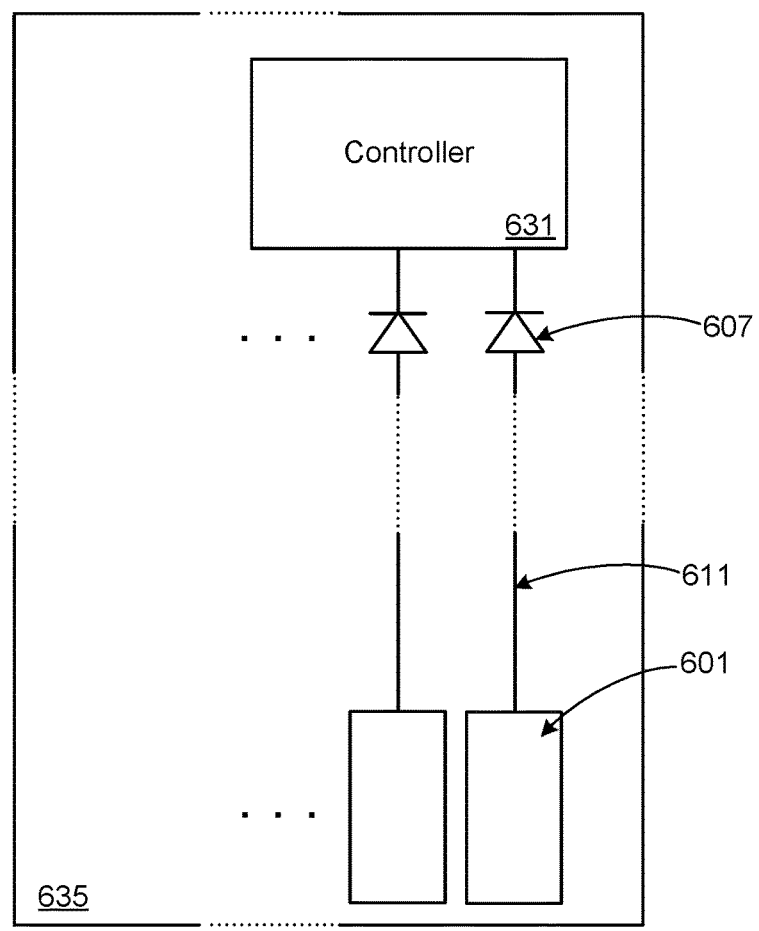
FIG. 6 looks at the inclusion of a diode for ESD protection into the path from an input pad to a memory controller or other ASIC.
Figure 5:
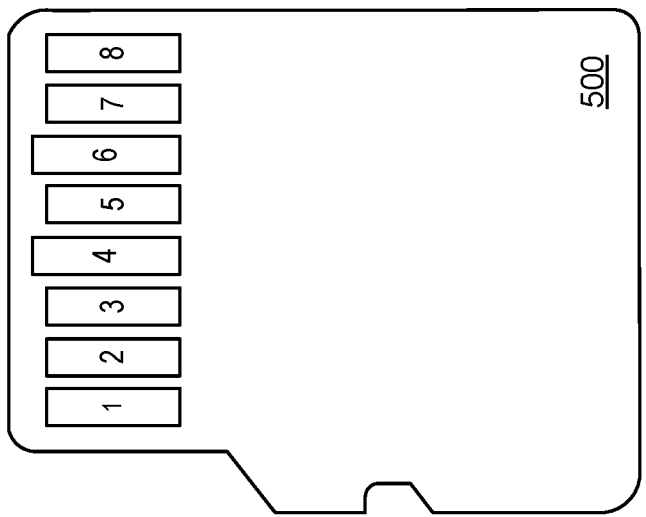
FIG. 5 is bottom view of a conventional MicroSD card including one row of interface pins.

FIG. 5 shows the underside of an example of a conventional MicroSD (OD) card 500 including a single row interface pins or pads. The MicroSD card 500 may for example be a UHS (ultra-high speed) I µSD card 50 having an eight pin interface including power, ground, clock, command and four data lines, or other type of SD card including a single row of interface pins. The insertion or removable of the card from a host, or its placement or removable into a case or pocket, for example, may induce an electrostatic charge upon the pads. Referring back to FIG. 4, the pads may be formed on the bottom of PCB 235 and connected to the controller 231. The generation of an electrostatic charge on an input pad can lead to an ESD event, where an electric pulse is transmitted from the pad to the controller ASIC 231. To protect the controller from such a voltage pulse, one technique is to place a diode along the input path from a pad to the controller or other circuit elements downstream from the input pad. FIG. 6 presents a schematic representation of an example.

FIG. 6 looks at the inclusion of a diode 607 for ESD protection into the path from an input pad 601 to a controller 631 or other ASIC. Although frequently referred here as an input pad, the same pad can serve more generally for input and output of signals for the memory card or other device. For purposes of this discussion, other elements (such as input drivers and output drivers) in the path of the wire bonds or lines 611 between the input pad 601 and the controller 631 are not shown. For the embodiment represented in FIG. 6, the pad 601 and controller 631 are shown attached or mounted on the same side of the PCB 635. Referring back to the embodiment represented in FIG. 4, the pads 601 can be on the underside (and not shown) of PCB 235, where the lines 611, diodes 607, and other elements can also be placed. In an SD type card, as illustrated in FIG. 5, there would be a corresponding number of pads 601, lines 611, and diodes 607 for elements connecting to the controller 631. Others of the pads, such as the high (Vdd) and low (Vss, commonly referred to as ground) voltage levels, may not run directly to the controller 631 but include a capacitor along their paths and not have as a great a need of ESD protection.

The inclusion of the diode 607 can help prevent the transmission of an ESD event on the pad 601 along line 611 to the controller 631. The diode characteristics can be chosen based on the amount of protection thought to be needed. In the example of SD and MicroSD cards, this is taken to be +/−4 kV, such as can be tested through an ESD Gun test. Consequently, existing SD type cards have been designed with protection diodes 607 sized accordingly. However, as memory cards and other memory system move to higher data rates, such ultra-high speed card (e.g. UHS-II) designs within SD standards or to able to support PCIe standards (PCIe), such protection diodes 607 make it difficult to achieved the designed transfer rates of data and commands. For example, in some cases the lines are expected to support rates of 500 MB/s or more (e.g., 985 MB/s for SD express card). To achieve this rate, the size of the protection diodes 607 can be made smaller, but at the cost of reduced ESD protection levels.

Figure 7:
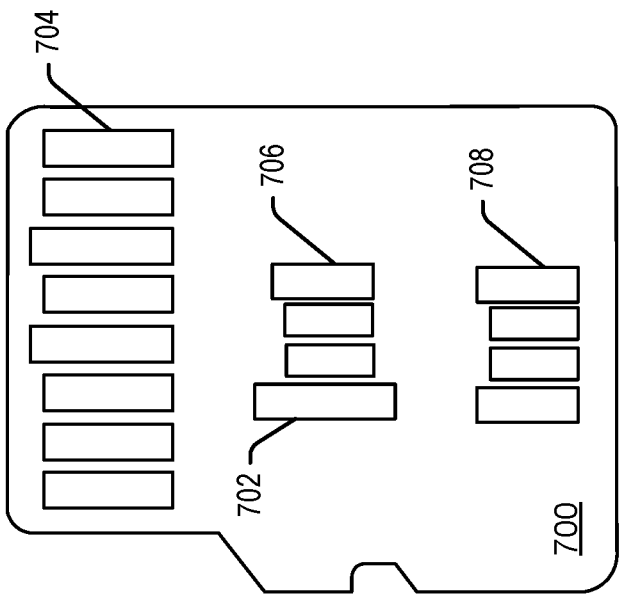
FIG. 7 illustrates an embodiment of an SD type card that includes a standard of SD contacts and also a set of contacts to support transfers according to the PCIe standard.

FIG. 7 illustrates an embodiment of an SD type card (e.g., SD, MicroSD, nanoSD) that includes a standard of SD contacts (as in FIG. 5) and also a set of contacts to support transfers according to the PCIe standard. Referring now to FIG. 7, there is shown a MicroSD card 700 including a plurality of interface pins or input pads 702 including multiple rows of input pads 702. In one embodiment, the MicroSD card 700 is configured to operate according to the PCI-Express™ (PCIe) expansion bus standard adapted into a MicroSD card form factor. However, it is understood that the MicroSD card 700 may be configured according to any of a variety of other standard and non-standard bus protocols which include interface pins in addition to a single row of legacy interface pins. As one further example, the MicroSD card 700 may be configured to operate according to the UHS-II standard. In another example, the card 700 may be configured as a Universal Flash Storage (UFS) card, which has a very similar shape to a MicroSD card, including multiple rows of interface pins that may be inserted in a connector and may be configured to operate according to the UFS specification.

The embodiment shown in FIG. 7 includes a first row 704 of legacy interface pins 702, conforming in number and position to interface pins provided for example on a UHS-I MicroSD card having a single row of interface pins. The first row 704 may include interface pins conforming in number and/or position to interface pins of a memory card standard other than UHS-I in further embodiments.

The embodiment of the MicroSD card 700 in FIG. 7 further includes a second row 706 and a third row 708 of interface pins 702. In FIG. 7 and the embodiments explained below, interface pins 702 in MicroSD card 700 in rows or columns other than row 704 of legacy interface pins may be referred to as non-legacy interface pins 702.

The illustrated embodiment of FIG. 7 includes four vertically oriented non-legacy interface pins 702 in the second row 706, and four vertically oriented non-legacy interface pins 702 in the third row 708. It is understood that the number and size of the interface pins 702 in rows 706 and 708 may vary in further embodiments, based for example in part on functionality of the respective pins 702. The vertical position (i.e., along the length dimension of the MicroSD card 700) of the pins 702 in the rows 706 and/or 708 may vary from that shown in FIG. 7 in further embodiments.

In embodiments, the three rows 704, 706 and 708 provide sixteen interface pins 702 supporting power, ground and signal transfer of both the SD and PCIe bus standard. However, there may be more or less pins than that in further embodiments. For example, some embodiments may have seventeen or eighteen interface pins 702, in multiple rows such as for example three rows, which together are configured to operate according to the SD and PCIe bus standard.

As noted, the interface pins may be configured to operate according to other bus standards in further embodiments. In one such further embodiment, the MicroSD card 700 may operate according to the UHS-II MicroSD standard, with the pins 702 in the row 704 conforming in size and functionality to the size and functionality of the interface pins in the first row of a conventional UHS-II MicroSD card. The interface pins in the rows 706 and 708 may likewise conform to the size and functionality of the interface pins in the second row of a conventional UHS-II MicroSD card.

For the pads using the traditional SD pads and protocol, which operates at a lower transfer rate than the PCIe standard, the interface can use the protection diode values as before; but to support higher data transfer rates of the PCIe interface the diode parameters should be changed. As this will lower the amount of ESD protection, other techniques can be incorporated to increase ESD protection. More specifically, the following presents embodiments that add spark gaps at the input pads. After the spark gap breaks down, harmful ESD currents can be diverted (shunted) away from ASIC inputs. To help induce the discharge prior to the (reduced) protection diode turning on, a series impedance can be included between the pad and the diode.

Figure 8:
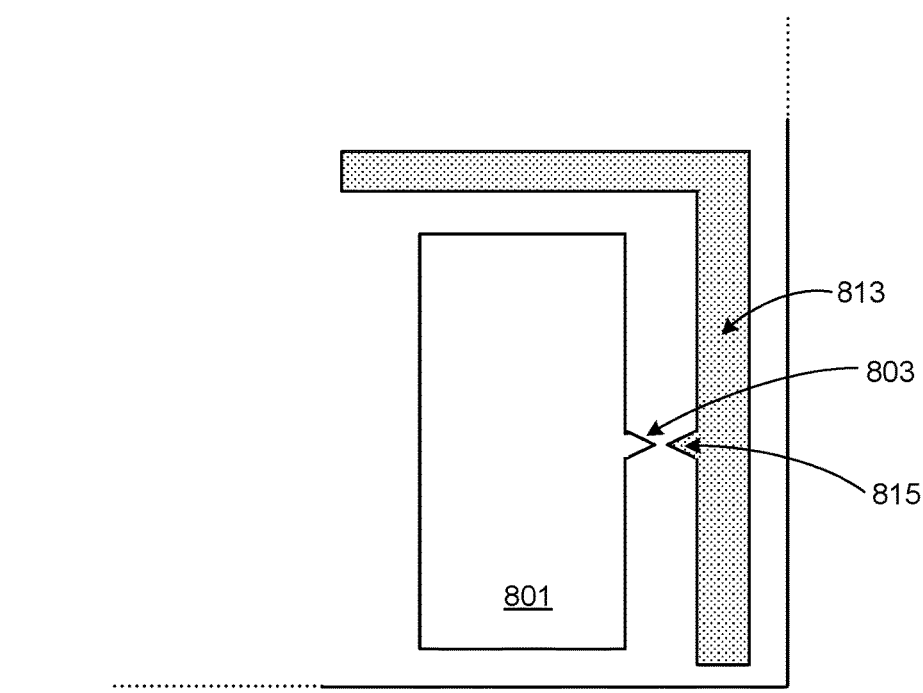
FIG. 8 illustrates the introduction of a spark gap between the pad and an adjacent conducting structure.

FIG. 8 illustrates the introduction of a spark gap between the pad and an adjacent conducting structure. As represented in FIG. 8, an input pad 801 attached to a PCB is adjacent to an adjacent conductive frame structure 813 mounted on the PCB, that could be made of, for example, copper, or other conducting material. The structure 813 can be a "ground" or "return" and will be set at the ground (Vss) when the device is in operation, but when not connected to a host will be floating, which is usually the situation in which ESD is a concern. On the pad 801 and frame structure 813 are respective point structures 803 and 815 that are aligned to be adjacent to each other and configured to form a spark gap.

To provide examples of the scale involved for embodiments based on an SD type card embodiment, the separation of the conductive frame structure 813 from the pad 801 can be on the order of 100 μm to 200 μm away from the location of the point structures and in the range of 4 μm to 50 μm where the point structures 803 and 815 are proximate.

The spark gap can provide ESD protection by breaking down and shunting current away from an ASIC to which the pad 801 is connected. Additionally, as the point structure adds no extra capacitance along the line 611 (referring back to FIG. 6) connecting pad 601 to ASIC 631, it will not adversely affect the allowable data transfer rate in the way that increasing the size of diode 607 would. As the use of a sharp point on the structures 803 and 815 concentrates the electric field when the pad 801 receives a voltage pulse, the sharp points reduce the breakdown voltage and control the breakdown location.

Figure 9:
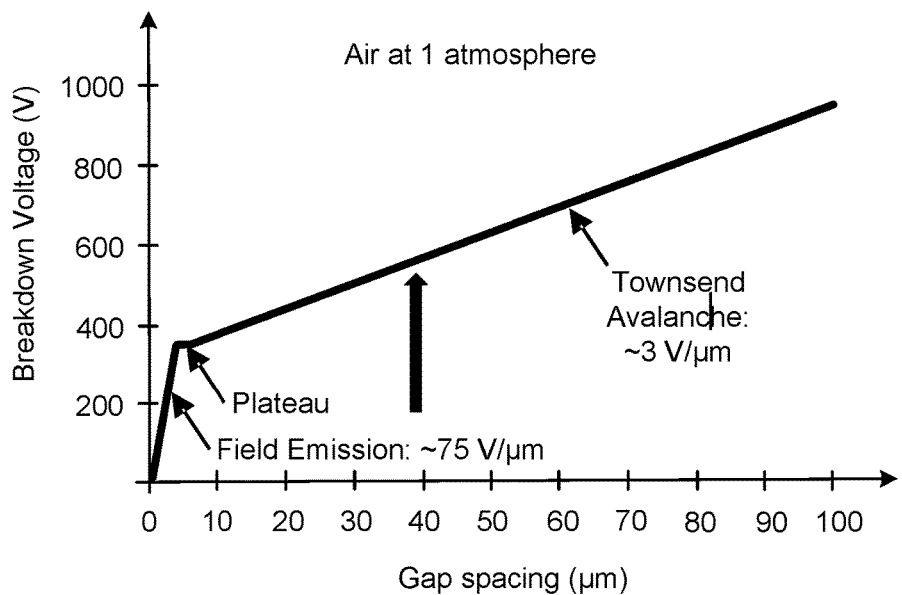
FIG. 9 illustrates the relationship between gap spacing and breakdown voltage.
Figure 10:
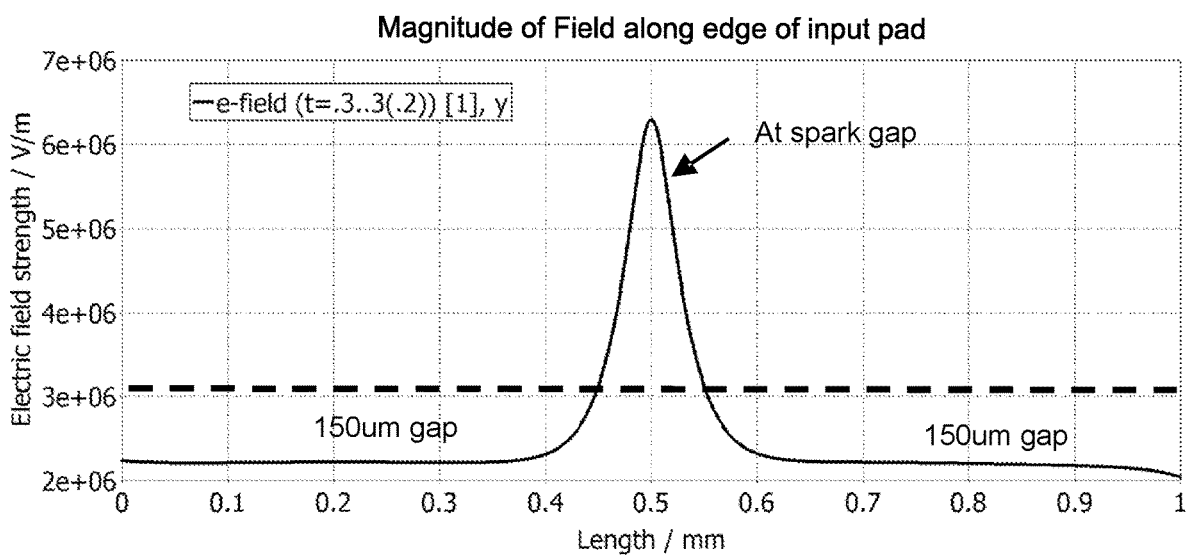
FIG. 10 illustrates the relationship between the placement of the spark gap and the resultant electric field strength.

FIGS. 9 and 10 consider the physics of the breakdown mechanism further. More specifically, FIG. 9 illustrates the relationship between gap spacing and breakdown voltage and FIG. 10 illustrates the relationship between the placement of the spark gap and the resultant electric field strength.

FIG. 9 shows the breakdown voltage in volts as a function of the gap spacing in μm when the gap is an air gap at standard atmospheric pressure of one atmosphere. The graph illustrates two distinction regions. Below about 4 μm the primary mechanism is field emission, corresponding to an electric field of around 75V/μm, while from around 8-10 μm up, the mechanism is Townsend avalanche, corresponding to an electric field level of around 3V/μm, with a plateau region in between where the dominant mechanism sits. In particular, the breakdown field is around 3V/μm if the gap 10 μm of higher. If the points of the spark gap are aligned such that the gap is around 40 μm, the breakdown voltage Vbreakdown=~550V. Consequently, to have a breakdown with a 40 μm gap will require an electric field in the gap of greater that 3V/μm.

As noted on FIG. 9, the gap is an air gap. The Townsend discharge, or Townsend avalanche, mechanism is a gas ionization process where free electrons are accelerated by the electric field, collide with gas molecules, and consequently free additional electrons. Those electrons are in turn accelerated and free additional electrons. The result is an avalanche multiplication that permits electrical conduction through the gas. The discharge requires a source of free electrons as well a significant electric field. Consequently, the embodiments described here use an air gap, as this can provide the source of free electrons, whereas if there were a filled with a dielectric material, for example, this would not be the case.

FIG. 10 illustrates the electric filed strength along the edge of the pad 801, where the point structure 803 is centered at 0.5 mm along the axis. At the spark gap, the separation is 40 μm at the point structures and to either side the gap (away from the points) the separation is 150 μm. A field strength of a little over 3V/μm is indicated by the broken line. At illustrated in FIG. 10, the field strength is sharply peaked at the point, being enhanced be a factor of ~6 and readily exceeding the 3V/μm value to induce breakdown at the point regions.

Figure 11:
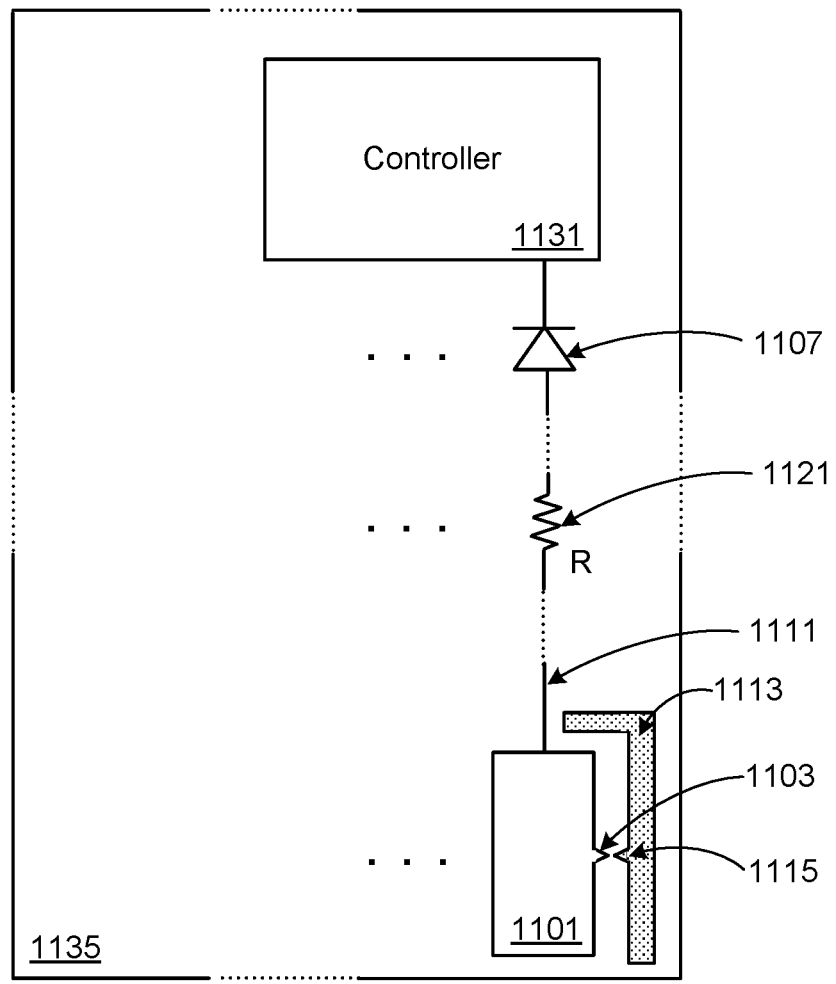
FIG. 11 illustrates the introduction of a resistance into the path between an input pad with a point structure and an ASIC in order to help induce a discharge through a spark gap in response to an ESD.

To enable to the spark gap to work during an ESD event, the device needs to be configured such that a voltage pulse at the input pad is discharged across the spark gap prior to its transmission to the ASIC; but at the same time, the device will still need to be able to support a specified data transfer rate. FIG. 11 illustrates an embodiment for inducing such a discharge.

FIG. 11 illustrates the introduction of a resistance into the path between an input pad with a point structure and an ASIC in order to help induce a discharge through a spark gap in response to an ESD. More specifically, similarly to FIG. 6, a non-volatile memory controller or other ASIC 1131 is mounted on a circuit board 1135 and connected through line 1111 to an input pad 1101. As in FIG. 8, the pad 1101 is adjacent to a frame structure 1113 and have respective point structures 1103 and 1115 aligned to be proximate to one another in order to form the spark gap. In order to induce a discharge across the spark gap in response to an ESD event, the line 1111 includes a diode 1107 and, between the pad 1101 and diode 1107, a resistor R 1121.

To be able to maintain a high data rate, the size of diode 1107 will typically be smaller that would be used (as in FIG. 6 and diode 607) to provide sufficient ESD protection on its own. The resistance R 1121 is configured to induce an electrical discharge from the point structure 1103 of the corresponding input pad 1101 to the proximate point structure 1115 of the conductive frame structure 1113 in response to an electrostatic pulse received by the corresponding input pad 1101 exceeding a voltage level that is less than a maximum specified ESD event. The idea that the resistor R 1121 will be large enough to induce a discharge across the spark gap before the diode 1107 turns on and pass the voltage pulse to ASIC 1131; but, at the same time, the value of the resistance of R 1121 should be keep as small as practical while still inducing this discharge across the spark gap, again in order to be able to maintain a high data transfer rate and not induce any unnecessary power dissipation.

Figure 12:
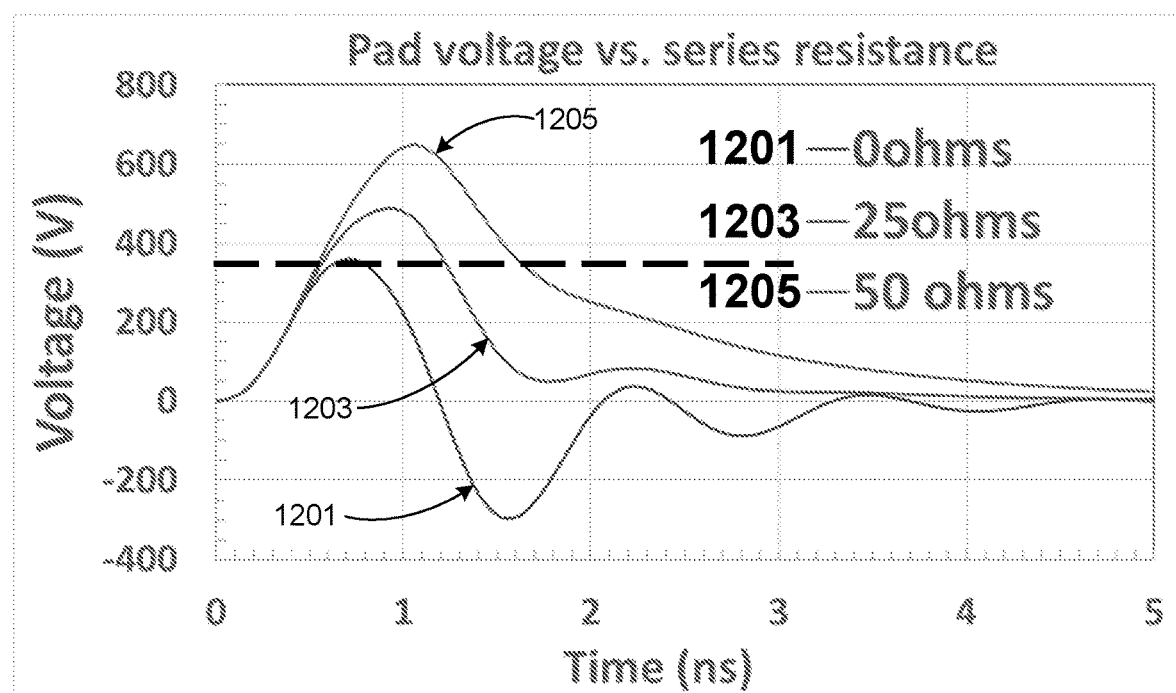
FIG. 12 illustrates the voltage level on a pad as a function of time for different values of the series resistance of FIG. 11 in response to a 4 kV ESD gun test.

For example, referring back to the discussion of FIGS. 9 and 10 and the example values described there for ESD to a floating SD-type card, the series resistance R 1121 should be enough to create a voltage difference between the pad 1101 and the conductive frame structure 1113 of 350V or more to induce a discharge across the spark gap. FIG. 12 considers the response of a pad in response to a voltage pulse of 4 kV. The element 1107 is here referred to, and is represented, as a diode. More generally, other ESD protection devices can be used, where examples can include varistors, Zener diodes, transient voltage suppression (TVS) devices, polymers (exhibiting internal breakdown), ceramic bypass capacitors, and series inductors. For the selected ESD protection device 1121, the series resistance R 1121 will again have a value selected create a voltage difference between the pad 1101 and the conductive frame structure 1113 to induce a discharge across the spark before the voltage pulse is transmitted on the controller 1131 or other connected ASIC. In the following, the ESD protection device will be referred to as a diode, although more generally other embodiment for the ESD protection devices can be similarly used.

More specifically, FIG. 12 illustrates the voltage level on a pad 1101 as a function of time for different values of the series resistance R 1121 in response to a 4 kV ESD gun test. In response the voltage pulse, the voltage level on the pad 1201 will initial ramp up and then dissipate over a few nanoseconds. To induce a discharge over the spark gap for the example value discussed above with respect to FIGS. 9 and 10, voltage difference of around 375V is needed, as represented at the broken line in FIG. 12. FIG. 12 illustrates the response for three different resistance values, with 1201 corresponding to a resistance of 0 ohms (i.e., no introduced resistance R 1121), 1203 corresponding to a resistance of 25 ohms, and 1205 corresponding to 50 ohms. As illustrated, the 0 ohm trace of 1201 barely reaches the 375V line and may not reliably induce a discharge across the spark gap. The 50 ohm trace 1205 peaks significantly above the 375V line, indicating that it is larger than required. The 25 ohm trace 1203 extends above the 375V with enough margin that a somewhat lower value for the resistance R 1121 should be sufficient to reliable trigger a discharge across the spark gap based on the specified voltage value of 375V. For example, the addition of a series resistance R 1121 of 10 ohms to 20 ohms can be used to make the spark gap work in this example.

When a spark gap triggers, a relatively high current flows through the point structures 1103 and 1115 heating the points. This may cause the sharp point to melt, increasing the spacing of the gap and reducing the degree of ESD immunity. To help guard against this problem, some embodiments can use multiple spark gaps to guard against additional ESD event, where FIG. 13 illustrates an example.

Figure 13:
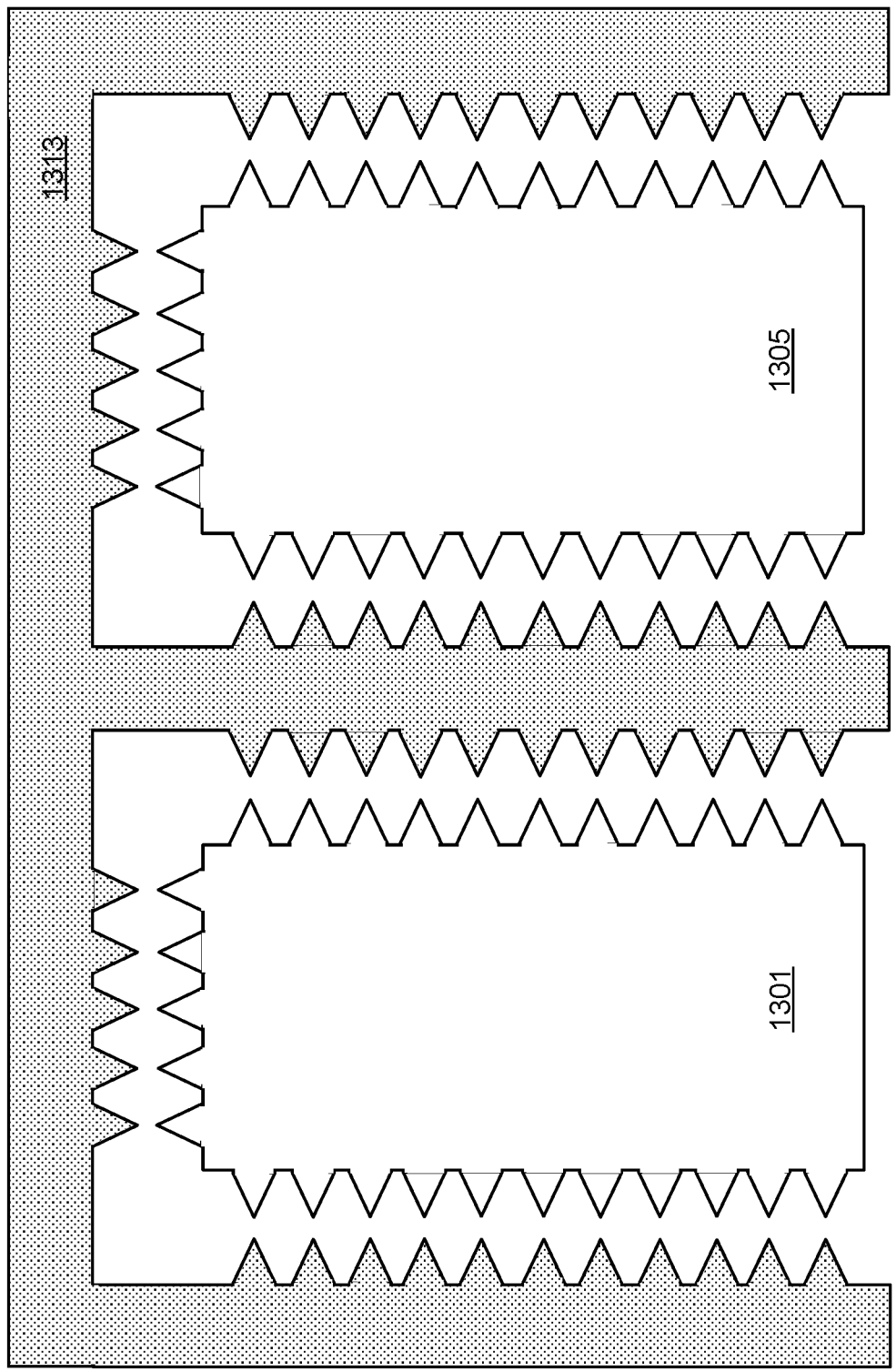
FIG. 13 illustrates an embodiment of input pads each having multiple point structures along the edges and an adjacent conductive frame structure with corresponding point structures aligned form multiple spark gaps.

FIG. 13 illustrates an embodiment of signal or input pads (two are shown at 1301 and 1305) each having multiple point structures along the edges, forming a serrated edge. An adjacent conductive frame structure 1313 also has a series of point structures that are aligned with those on the input pads 1301 and 1305. The frame structure 1313 can be a "ground" or "return" that can be made of, for example, copper and is set at the ground (Vss) when the device is in operation and can be shared by multiple pads, but would be floating when the device in not connected to a host. During an ESD event, if the voltage surge causes the points of one spark gap melt, the additional spark gaps will be available for future ESD events, providing additional ESD immunity.

Figure 14:
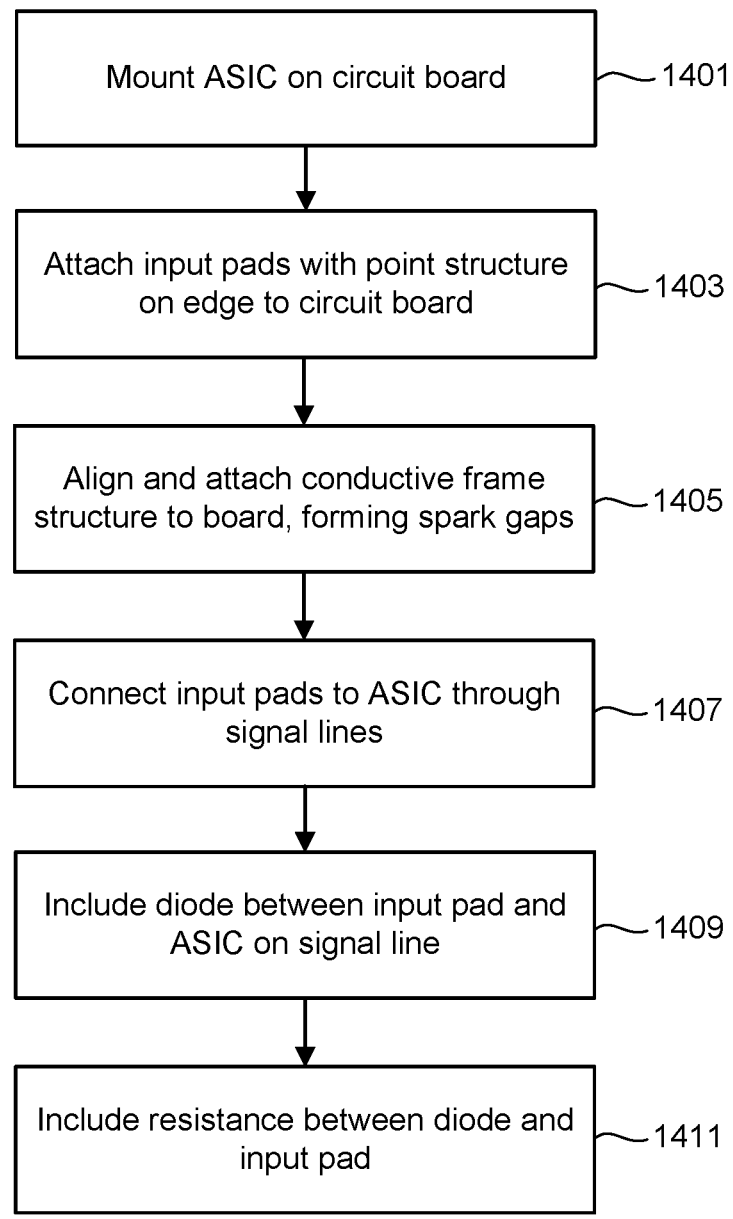
FIG. 14 is a flowchart of one embodiment for a process of forming a device having the described ESD protection mechanism.

FIG. 14 is a flowchart of one embodiment for a process of forming a device having the described ESD protection mechanism, where reference is made to the embodiment of FIG. 11. At step 1401 the memory controller or other ASIC 1131 is mounted onto the circuit board and at step 1403 one or more input pads 1101 are attached to the circuit board, where these steps and subsequent steps can be performed in various orders depending on the embodiment. The pads 1101 include one or more point structures along their edges. A conductive frame structure 1113 is attached to the circuit board at step 1405, where the frame structure also has one or more point structures 1115 along its edges. When mounting the conductive frame structure 1113 is attached at step 1405, it is attached adjacent to the one or more input pads 1101 and the points of the conductive frame structure 1113 are aligned with the point structures 1103 on the input pads 1101 to form one or more spark gaps for each of the input pads 1101. In some embodiments the device may also include some inputs pads, such as supply level pads, that do not include such spark gaps.

To connect the pads 1101 to the ASIC 1131, at 1407 a corresponding signal line 1111 is formed or attached from each of the pads 1101 to ASIC 1131 and any other ASICs to which the pads 1101 are to be connected. Each of the signal lines 1111 includes a diode 1107 that at step 1409 is formed or attached between the corresponding input pad 1101 and the ASIC 1131. The series resistance R 1121 between the diode 1107 and input pad 1101 for each of the signal lines 1111 is formed or attached at step 1411. As discussed above, the resistance 1121 is formed to have a value to induce a discharge across one of the spark gaps, where value can depend upon combinations of the dimension of the spark gap, the intensity of the ESD event for which protection is wanted, the size of the diode 1107, and possible other factors related to the geometry and materials of the device. As noted, the steps of FIG. 14 can be performed in various orders depending on the embodiment; for example, the resistance R 1121 may have been formed on the circuit board prior to the other elements being attached or mounted.

The techniques described present a feasible spark gap design to provide ESD protection for ASIC inputs of a device, such as an SD or MicroSD memory card, for example. The inclusion of a specific series impedance (e.g. resistor) in the data lines can be included to induce the spark gap to trigger. By including multiple such spark gaps around the pads of the device, the mechanism can provide immunity to multiple ESD events.

Considering the above description, embodiments include an apparatus having a circuit board and an integrated circuit mounted on the circuit board. A first set of one or more input pads is mounted on the circuit board, each input pad of the first set including a point structure configured to concentrate an electric field strength resultant from a voltage level on the input pad. A conductive frame structure is adjacent to the input pads of the first set. The conductive frame structure includes one or more point structures, one of which is proximate to, but separated by an air gap from, the point structure of each of the one or more input pads of the first set. One or more first signal lines are each connected between a corresponding one of the input pads of the first set and the integrated circuit. Each of the first signal lines includes an electrostatic discharge (ESD) protection device through which the corresponding input pad of the first set is connected to the integrated circuit and a resistance through which the corresponding input pad of the first set is connected to the ESD protection device. The resistance is configured to induce an electrical discharge from the point structure of the corresponding input pad of the first set to the proximate point structure of the conductive frame structure in response to an electrostatic pulse received by the corresponding input pad of the first set exceeding a voltage level.

Other embodiments include a method including mounting an integrated circuit on a circuit board and attaching one or more input pads to the circuit board, each of the input pads having one or more point structures formed along an edge. The method further includes aligning and attaching a conductive frame structure to the circuit board. The conductive frame structure has one or more point structures formed along the edge thereof, the conductive frame structure being aligned such that for each of the one or more input pads the points structures of the conductive frame structure to form one or more spark gaps between the point structures of the conductive frame structure and one or more point structures of each of the one or more input pads. The method also includes connecting each of the one or more input pads to the integrated circuit through a corresponding signal line. The connecting for each of the signal lines includes: connecting the input pad to the integrated circuit through an electrostatic discharge (ESD) protection device; and connecting the input pad to the ESD protection device through a resistance, the resistance having a value configured to induce an electrical discharge across one or more of the spark gaps in response to an ESD event at the input pad.

Other embodiments present a memory package including a controller circuit and one or more non-volatile memory circuits connected to the controller circuit. The memory package also includes a package board on which the controller circuit and the one or more non-volatile memory circuits are mounted. A first set of input pads each includes one or more points configured to concentrate an electric field strength resultant from a voltage on the input pad. A conductive frame structure is adjacent to the first set of input pads of the first set, the frame structure including one or more point structure, one of which is proximate to, but separated by an air gap from, the points of each of the one or more input pads of the first set. A first set of signal lines are each connected between a corresponding one of the first set of input pads and the controller circuit and each including a resistance connected in series with a diode, the resistance connected between the diode and the corresponding one of the first set of input pads, a value of the resistance configured to have a value to induce a discharge through the one or more points of the corresponding input pad to the conductive frame structure prior to the diode turning on in response to a voltage pulse exceeding a first value.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension. An embodiment of the present technology will now be explained with reference to the following figures.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a circuit board;
   an integrated circuit having a plurality of interface pins and mounted on the circuit board;
   a first set of a plurality of input pads mounted on the circuit board, each input pad of the first set including a point structure configured to concentrate an electric field strength resultant from a voltage level on the input pad;
   a conductive frame structure adjacent to the input pads of the first set, the conductive frame structure including one or more point structures, one of which is proximate to, but separated by an air gap from, the point structure of each of the one or more input pads of the first set; and
   a plurality of first signal lines each connected between a corresponding one of the first set of the input pads and a corresponding one of the interface pins of the integrated circuit, each of the first signal lines including:
      a diode connected between the corresponding input pad of the first set and the corresponding interface pin of the integrated circuit such that:
         in response to a voltage level of a signal applied to the diode from the corresponding input pad exceeding a turn on voltage for the diode, transferring the signal from the corresponding input pad of the first set to the corresponding interface pin of the integrated circuit; and
         in response to the voltage level of the signal applied to the diode from the corresponding input pad not exceeding the turn on voltage for the diode, not transferring the signal from the corresponding input pad of the first set to the corresponding interface pin of the integrated circuit; and
      a resistor through which the corresponding input pad of the first set is connected to the diode, the resistor having a resistance value configured to induce an electrical discharge from the point structure of the corresponding input pad of the first set to the proximate point structure of the conductive frame structure prior to the voltage level applied to the diode from the corresponding input pad exceeding the turn on voltage for the diode in response to an electrostatic pulse received by the corresponding input pad of the first set exceeding a first voltage level.

2. The apparatus of claim 1, wherein the integrated circuit is a non-volatile memory controller.

3. The apparatus of claim 2, wherein the non-volatile memory controller is configured to receive signals over the first set of input pads according to a PCIe (Peripheral Component Interconnect Express) protocol.

4. The apparatus of claim 2, wherein the non-volatile memory controller is configured to receive signals over first set of input pads at a data rate of 500 MB/s.

5. The apparatus of claim 2, wherein the apparatus is non-volatile memory card having a Secure Digital (SD) type format.

6. The apparatus of claim 2, further comprising:
   a second set of one or more input pads mounted on the circuit board; and one or more second signal lines each connected between a corresponding one of the input pads of the second set and the integrated circuit.

7. The apparatus of claim 6, wherein:
the non-volatile memory controller is configured to receive signals over the first set of input pads according to a PCIe (Peripheral Component Interconnect Express) protocol; and
the non-volatile memory controller is configured to receive signals over the second set of input pads according to an SD (Secure Digital) protocol.

8. The apparatus of claim 1, wherein a dimension of the air gap is in a range of 4 μm to 50 μm.

9. The apparatus of claim 8, wherein, away from the point structures, a separation of the input pads of the first set from the conductive frame structure is in a range of 100 μm to 200 μm.

10. The apparatus of claim 1, wherein the point structure of each of the input pads of the first set includes a plurality of individual points.

11. The apparatus of claim 1, wherein a value of the resistance is in a range of 10 ohms to 20 ohms.

12. A method of protecting an integrated circuit from electrostatic discharge, comprising:
mounting the integrated circuit on a circuit board, the integrated circuit having a plurality of interface pins;
attaching a plurality of input pads to the circuit board, each of the input pads having one or more point structures formed along an edge thereof;
aligning and attaching a conductive frame structure to the circuit board, the conductive frame structure having one or more point structures formed along the edge thereof, the conductive frame structure being aligned such that for each of the one or more input pads the points structures of the conductive frame structure form one or more spark gaps between the point structures of the conductive frame structure and one or more point structures of each of the one or more input pads;
connecting each of the plurality of input pads to a corresponding interface pin of the integrated circuit through a corresponding signal line, the connecting for each of the signal lines including:
connecting the input pad to the corresponding interface pin of the integrated circuit through a diode, the diode configured to:
in response to a voltage level of a signal applied to the diode from the corresponding input pad exceeding a turn on voltage for the diode, transfer the signal from the corresponding input pad to the corresponding interface pin of the integrated circuit; and
in response to the voltage level of the signal applied to the diode from the corresponding input pad not exceeding the turn on voltage for the diode, to not transfer the signal from the corresponding input pad of the first set to the corresponding interface pin of the integrated circuit; and
connecting the input pad to the diode through a resistor, the resistor having a resistance value configured to induce, prior to the voltage level applied to the diode from the corresponding input pad exceeding the turn on voltage for the diode, an electrical discharge across one or more of the spark gaps in response to an electrostatic pulse received at the input pad exceeding a first voltage level.

13. The method of claim 12, further comprising:
subsequently packaging the circuit board as a non-volatile memory card having a Secure Digital (SD) type card form factor.

14. The method of claim 12, the conductive frame structure being aligned such that one or more spark gaps are air gaps having a dimension in a range of 4 μm to 50 μm between the point structures of the conductive frame structure and one or more point structures of each of the one or more input pads.

15. The method of claim 12, the conductive frame structure being aligned such that, a separation of the input pads from the conductive frame structure is in a range of 100 μm to 200 μm.

16. A memory package, comprising:
a controller circuit having a plurality of interface pins;
one or more non-volatile memory circuits connected to the controller circuit;
a package board on which the controller circuit and the one or more non-volatile memory circuits are mounted;
a first set of input pads each including one or more points configured to concentrate an electric field strength resultant from a voltage on the input pad;
a conductive frame structure adjacent to the first set of input pads of the first set, the frame structure including one or more point structures, one of which is proximate to, but separated by an air gap from, the points of each of the one or more input pads of the first set; and
a first set of signal lines each connected between a corresponding one of the first set of input pads and a corresponding one of the interface pins of the controller circuit and each including:
a diode connected between the corresponding input pad of the first set and the corresponding interface pin, the diode configured to:
in response to a voltage level of a signal applied to the diode from the corresponding input pad exceeding a turn on voltage for the diode, transfer the signal from the corresponding input pad of the first set to the corresponding interface pin of the integrated circuit; and
in response to the voltage level of the signal applied to the diode from the corresponding input pad not exceeding the turn on voltage for the diode, not transfer the signal from the corresponding input pad of the first set to the corresponding interface pin of the integrated circuit; and
a resistor connected in series with a diode, the resistor connected between the diode and the corresponding one of the first set of input pads, the resistor having a resistance value configured to have a value to induce a discharge through the one or more points of the corresponding input pad to the conductive frame structure prior to the voltage level applied to the diode from the corresponding input pad exceeding the turn on voltage for the diode in response to a voltage pulse received by the corresponding input pad of the first set exceeding a first value.

17. The memory package of claim 16, wherein the memory package has a Secure Digital (SD) type card form factor.

18. The memory package of claim 16, wherein the controller circuit is configured to receive signals according to a PCIe (Peripheral Component Interconnect Express) protocol over the first set of input pads.

19. The memory package of claim 16, wherein the memory package further comprises:
- a second set of input pads; and
- a second set of signal lines each connected between a corresponding one of the second set of input pads and the controller circuit, wherein the controller circuit is configured to receive signals according to a Secure Digital (SD) protocol over the second set of input pads.

20. The memory package of claim 16, wherein the first value is 2 kV.

* * * * *